United States Patent
Sung et al.

(10) Patent No.: US 11,231,454 B2
(45) Date of Patent: Jan. 25, 2022

(54) APPARATUS FOR TESTING INTEGRATED CIRCUIT DEVICES AND METHOD THEREOF

(71) Applicant: UPE CO., Ltd., Gunpo-si (KR)

(72) Inventors: Eon Seok Sung, Gunpo-si (KR); Moo Jong Shin, Cheonan-si (KR)

(73) Assignee: UPE CO., Ltd., Gunpo-si (KR)

( * ) Notice: Subject to any disclaimer, the term of this patent is extended or adjusted under 35 U.S.C. 154(b) by 62 days.

(21) Appl. No.: 16/518,989

(22) Filed: Jul. 23, 2019

(65) Prior Publication Data

US 2020/0264228 A1 Aug. 20, 2020

(30) Foreign Application Priority Data

Feb. 15, 2019 (KR) ........................ 10-2019-0018118

(51) Int. Cl.
*G01R 15/20* (2006.01)
*G01R 31/28* (2006.01)

(52) U.S. Cl.
CPC ..... *G01R 31/2875* (2013.01); *G01R 31/2856* (2013.01)

(58) Field of Classification Search
CPC ............ G01R 31/2875; G01R 31/2856; G01R 31/319; G01R 31/3183; G11C 29/56016; G11C 29/56004
See application file for complete search history.

(56) References Cited

U.S. PATENT DOCUMENTS

| 2005/0036352 | A1 | 2/2005 | Norris et al. | |
| 2008/0164899 | A1* | 7/2008 | Ando | G01R 31/2874 324/750.13 |
| 2009/0306925 | A1* | 12/2009 | Lai | G01R 31/31704 702/117 |
| 2013/0002277 | A1* | 1/2013 | Song | G01R 31/31908 324/750.3 |
| 2013/0015869 | A1* | 1/2013 | Francisco | G01R 31/2875 324/750.03 |
| 2016/0357898 | A1* | 12/2016 | Johnson | G06F 30/398 |
| 2018/0136276 | A1* | 5/2018 | Shimizu | G01R 31/2875 |
| 2018/0165100 | A1* | 6/2018 | Natu | G06F 9/4406 |
| 2019/0056131 | A1* | 2/2019 | Warren | F24F 11/89 |

FOREIGN PATENT DOCUMENTS

| JP | H09-128996 A | 5/1997 |
| KR | 1020060037443 A | 5/2006 |

* cited by examiner

*Primary Examiner* — Dominic E Hawkins

(57) ABSTRACT

An apparatus for performing a test on an integrated circuit device is provided. The apparatus includes a processor, at least one mounting portion configured to accommodate at least one integrated circuit device to be tested, and an interface configured to connect the processor to the at least one integrated circuit device to allow data transmission and reception therebetween. The processor is configured to transfer a heating traffic data pattern, which is configured to raise a temperature of the at least one integrated circuit device to a target temperature according to heating test conditions, to the at least one integrated circuit device via the interface.

16 Claims, 5 Drawing Sheets

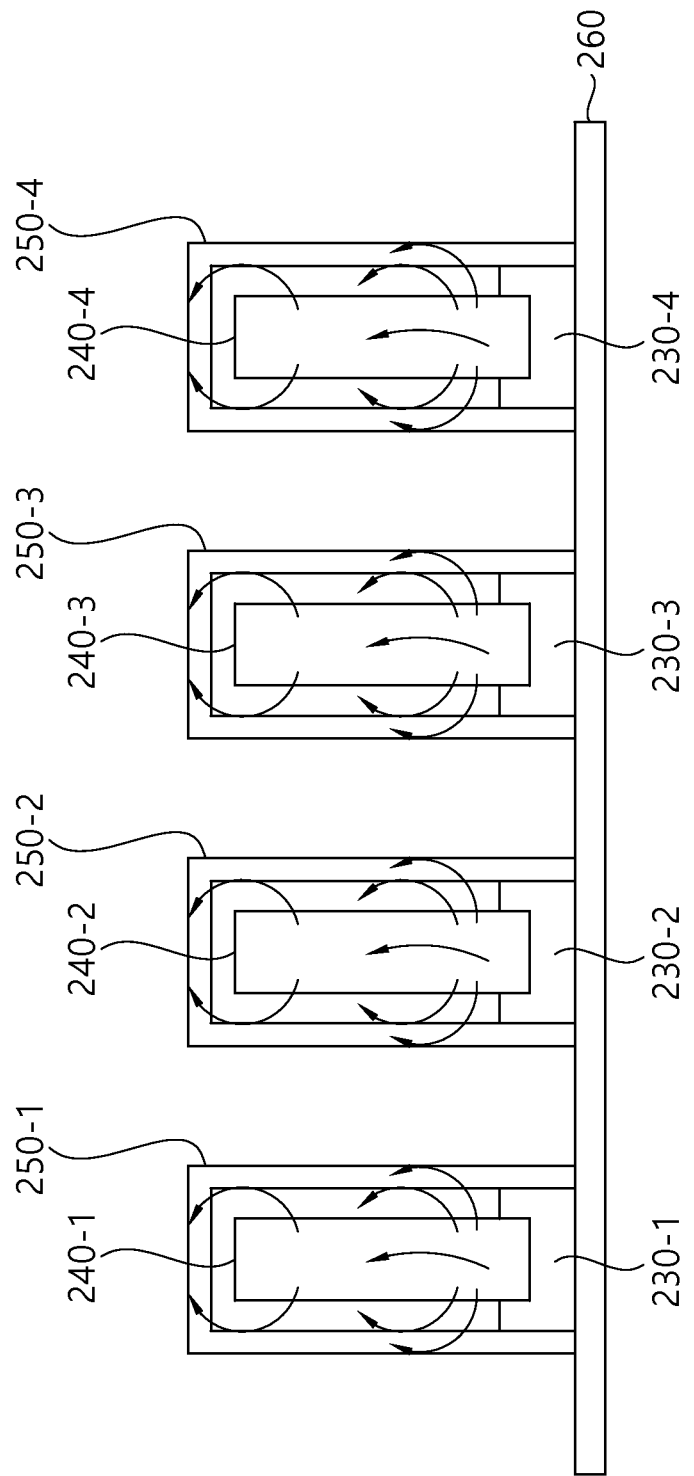

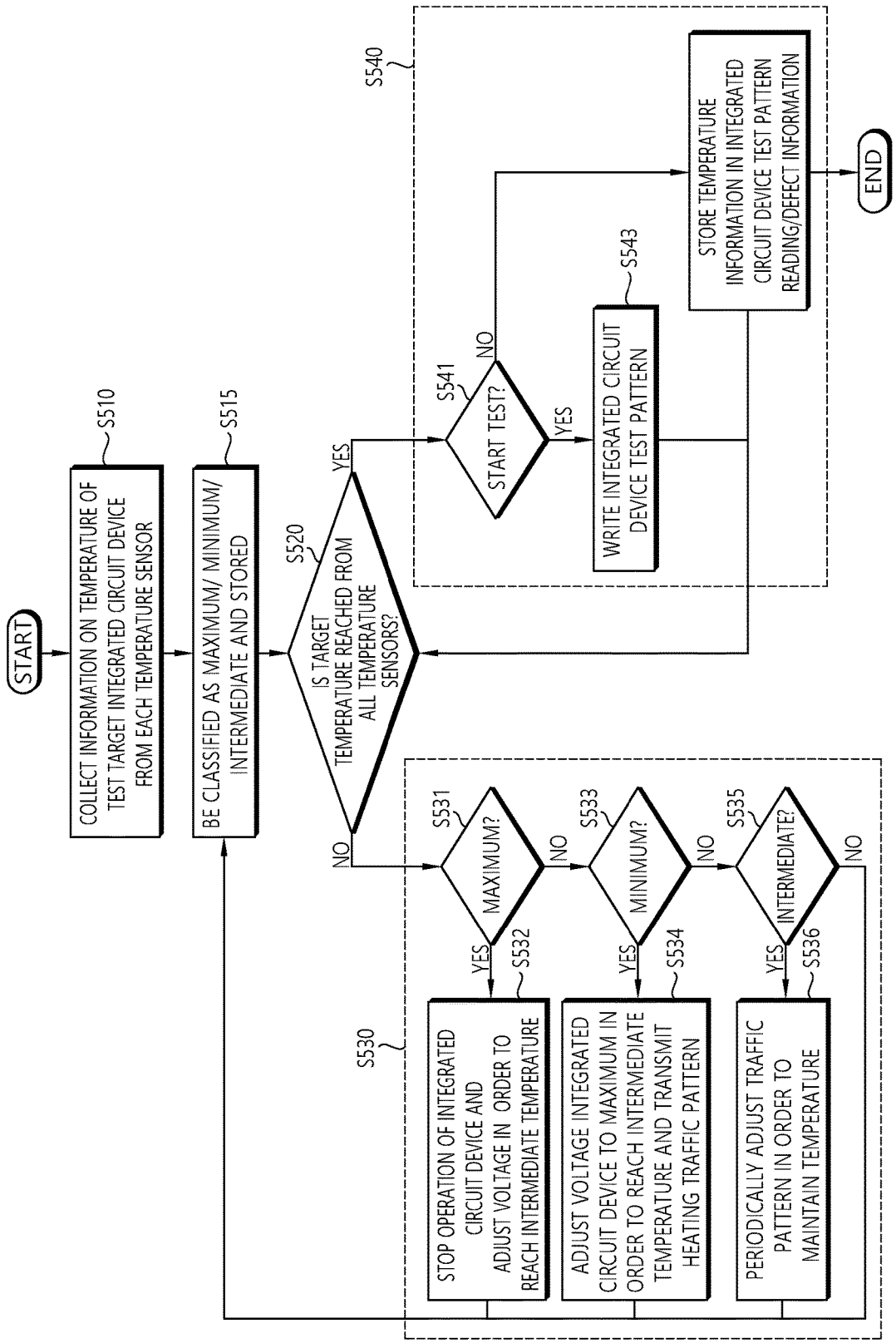

APPARATUS FOR TESTING INTEGRATED CIRCUIT DEVICES AND METHOD THEREOF

CROSS-REFERENCE TO RELATED APPLICATION

This application is based on and claims the benefit of priority to Korean Patent Application No. 10-2019-0018118, filed on Feb. 15, 2019, the disclosure of which is incorporated herein in its entirety by reference.

BACKGROUND OF THE INVENTION

Field of the Invention

The present invention relates to testing of an integrated circuit device, and more particularly to an apparatus and method for performing a heating test at a predetermined temperature range for an integrated circuit device.

Related Art

For example, an integrated circuit device such as a memory module has a plurality of semiconductor chips located on one circuit, and the complexity of the integrated circuit is also increasing with the variety of functions required for the integrated circuit and the development of its performance. Therefore, before the produced integrated circuit is commercially available or formally used, it is required that the test of whether or not the integrated circuit operates normally is performed more precisely and reliably.

In this regard, for example, in the case of a memory module among semiconductor integrated circuit devices, two major tests can be performed on the produced memory module. First, AC testing and DC testing by automated dedicated test equipment (e.g., ATE (Automated Test Equipment)) should be performed, and then in order to determine whether the memory module is operating normally in an environment where the memory module is actually mounted and used, a mounting test should be performed, in which the memory module is directly mounted on the main board of the computer where the memory module is actually mounted and used, and the memory module is tested in accordance with the actual environment. Accordingly, when the test on the dedicated test equipment is completed, the device under test (DUT) is removed, and the DUT is mounted again on the main board of the mounting environment to perform the mounting test.

On the other hand, for example, a semiconductor integrated circuit device such as a memory module should be assured whether it also performs normal operation in a high temperature environment. Therefore, in a test and/or mounting test on an automated dedicated test equipment, the temperature of the integrated circuit device to be tested may be raised so that the integrated circuit device to be tested is positioned within a predetermined temperature range, and the integrated circuit device may be configured to test whether normal operation is performed at that temperature. This can be referred to as a high temperature test for an integrated circuit device. For high temperature testing, it is very important to raise the temperature of the integrated circuit device under test to a predetermined temperature and maintain the temperature for the test period in order to secure the reliability of the test. For high temperature testing of conventional integrated circuit devices, a method has been mainly used in which a chamber accommodating an integrated circuit device is provided and a heating means is disposed in the chamber to heat the inside of the chamber to reach a predetermined temperature range as previously mentioned. However, in such a chamber-based high temperature test, a temperature difference may occur among the spaces in the chamber depending on the position of the heating means in the chamber, and a desired temperature may be not applied to a specific integrated circuit device among a plurality of integrated circuit devices. More specifically, depending on the position of the heating means in the chamber, the temperature of one side in the chamber may be different from the temperature of the other side, so that a difference may occur in temperatures transmitted to a plurality of devices loaded in the chamber and tested. Accordingly, there is a problem in that a high temperature greater than a desired temperature may be applied to some devices, and a low temperature less than a desired temperature may be applied to other devices, thereby deteriorating the reliability of the test.

In addition, there is also a problem in that a separate heating means is used, which takes a long time in terms of power consumption and composition of the temperature environment. That is, the configuration of the test equipment is complicated by the provision of the chamber and the additional heating means added thereto, and the maintenance and repair of the test equipment becomes time-consuming and expensive.

SUMMARY OF THE INVENTION

It is an object of the present invention to provide an integrated circuit device testing apparatus capable of performing a heating test on an integrated circuit without having a chamber by transferring a heating traffic data pattern capable of raising the temperature of an integrated circuit to be tested to a target temperature using heat generated by the integrated circuit itself, to the integrated circuit to be tested.

It is another object of the present invention to provide an integrated circuit device testing method capable of performing a heating test on an integrated circuit without having a chamber by transferring a heating traffic data pattern capable of raising the temperature of an integrated circuit to be tested to a target temperature using heat generated by the integrated circuit itself, to the integrated circuit to be tested.

Technical objects to be achieved by the present invention are not limited to the aforementioned technical objects, and other technical objects not described above may be evidently understood by a person having ordinary skill in the art to which the present invention pertains from the following description.

According to an embodiment to solve the above-described problems, there is provided an apparatus for testing an integrated circuit device, including: a processor; at least one mounting portion configured to accommodate at least one integrated circuit device to be tested; and an interface configured to connect the processor to the at least one integrated circuit device to allow data transmission and reception therebetween, wherein the processor is configured to transfer a heating traffic data pattern, which is configured to raise a temperature of the at least one integrated circuit device to a target temperature according to heating test conditions, to the at least one integrated circuit device via the interface.

According to an aspect, the processor may be configured to transfer a test traffic data pattern to be used for testing an operation of the at least one integrated circuit device to the at least one integrated circuit device in response to a determination that the temperature of the at least one integrated circuit device has reached the target temperature.

According to an aspect, the apparatus may be configured to perform a heating test for the integrated circuit device without a heating chamber by transferring the heating traffic data pattern to the at least one integrated circuit device.

According to an aspect, the processor may be configured to receive information on the temperature of each of the at least one integrated circuit device from each temperature sensor embedded in the at least one integrated circuit device via the interface and to determine whether the temperature of each of the at least integrated circuit device has reached the target temperature based on the received information on the temperature.

According to an aspect, the processor may be configured to generate the heating traffic data pattern based on a difference between the temperature of each of the at least one integrated circuit device and the target temperature.

According to an aspect, the integrated circuit device may be a memory module, and the processor may be configured to generate the heating traffic data pattern such that as the difference between the temperature of each of the at least one integrated circuit device and the target temperature gets greater, more information is simultaneously recorded in the at least one integrated circuit device.

According to an aspect, the integrated circuit device may be a memory module, and the processor may be configured to generate the heating traffic data pattern such that as the difference between the temperature of each of the at least one integrated circuit device and the target temperature gets greater, broader bandwidth is simultaneously used in the at least one integrated circuit device.

According to an aspect, the processor may include a converged pattern generator and checker (CPGC) engine, and the heating traffic data pattern may be generated by selecting at least one of data patterns for a performance test of a memory device defined by the CPGC engine.

According to an aspect, the memory module may include at least one of double data rate (DDR) 3, DDR 4 and DDR 5 DRAM of JEDEC standard.

According to an aspect, the memory module may include at least one of an unbuffered dual in-line memory module (UDIMM), a small outline dual in-line memory module (SODIMM), a registered dual in-line memory module (RDIMM), and a load reduction dual in-line memory module (LRDIMM).

According to an aspect, the apparatus may be configured to perform a real clock test for the memory device by using a commercial processor including the CPGC engine as the processor.

According to an aspect, the apparatus may be configured to perform a mounting test for the at least one integrated circuit device without transferring the at least one integrated circuit device to a separate device after performing an automatic test equipment (ATE) test for the at least one integrated circuit device by using a commercial processor including the CPGC engine as the processor.

According to another embodiment to solve the above-described problems, there is provided a method of testing an integrated circuit device by a processor, the processor being configured to transmit and receive data to and from at least one integrated circuit device to be tested via an interface, the method including: receiving information on each temperature of the at least one integrated circuit device from each temperature sensor embedded in the at least one integrated circuit device via the interface; determining whether each temperature of the at least one integrated circuit device has reached a target temperature according to heating test conditions based on the received information on the temperature; and transferring a heating traffic data pattern, which is configured to raise the temperature of the at least one integrated circuit device to the target temperature, to the at least one integrated circuit device via the interface in response to a determination that each temperature of the at least one integrated circuit device has not reached the target temperature.

According to further another embodiment to solve the above-described problems, there is provided a method of testing an integrated circuit device by a processor, the method including: preparing at least one integrated circuit device to be tested; applying a heating traffic data pattern, which is configured to change a temperature of the at least one integrated circuit device to a target temperature, to the at least one integrated circuit device; and applying a test traffic data pattern to be used for testing an operation of the at least one integrated circuit device, to the at least one integrated circuit device.

According to further another embodiment to solve the above-described problems, there is provided a method of testing an integrated circuit device by a processor, the method including: receiving information on a temperature of each of at least one integrated circuit device; performing temperature control for each of the at least one integrated circuit device based on the information on the temperature; and applying a test traffic data pattern to be used for testing an operation of the at least one integrated circuit device, to at least one integrated circuit device.

According to an aspect, the performing temperature control may include: performing at least one of an operation stop of a first integrated circuit device and an operating voltage adjustment of the first integrated circuit device in response to a determination that a temperature of the first integrated circuit device is higher than a target temperature; and performing at least one of an operation of applying a heating traffic data pattern to a second integrated circuit device and an operation of adjusting an operating voltage of the second integrated circuit device to a maximum value in response to a determination that a temperature of the second integrated circuit device is higher than a target temperature.

According to an aspect, the performing of the temperature control may include: periodically adjusting a traffic data pattern applied to a third integrated circuit device in order to maintain a temperature of the third integrated circuit device in response to a determination that a temperature of the third integrated circuit device is within a target temperature range.

The disclosed technology may have the following effects. It is to be understood, however, that the scope of the disclosed technology is not to be construed as limited thereby, as it is not meant to imply that a particular embodiment should include all of the following effects or only the following effects.

According to the apparatus and method for performing a heating test on an integrated circuit without having a chamber by transferring a heating traffic data pattern capable of raising the temperature of an integrated circuit to be tested to a target temperature using heat generated by the integrated circuit itself, to the integrated circuit to be tested.

Therefore, it is possible to reduce the cost for forming a chamber and the provision of a heating means, which have been provided for the heating test of the integrated circuit device, and to apply the target temperature accurately and quickly to each integrated circuit device. Further, it is possible to solve the problem that the set temperature may be different for each integrated circuit device.

BRIEF DESCRIPTION OF THE DRAWINGS

FIG. 4 is a schematic diagram of heat generation according to an apparatus for testing an integrated circuit device according to a second embodiment.

FIG. 5 is a flowchart of a method of testing an integrated circuit device according to an embodiment of the present invention.

DETAILED DESCRIPTION OF THE INVENTION

Figure 1:
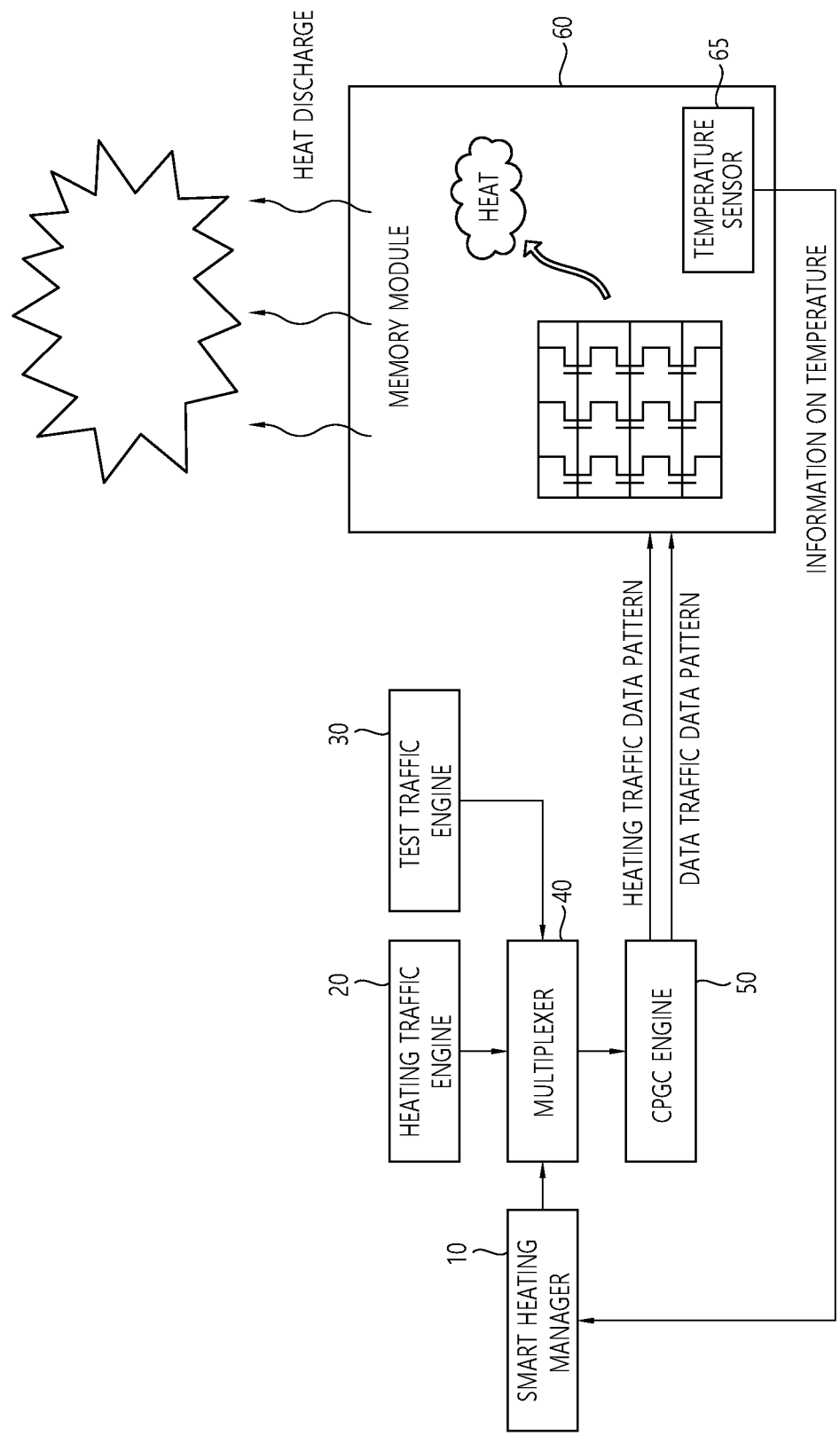
FIG. 1 is a conceptual diagram of a heating test for a memory module according to an embodiment of the present invention.

The present invention may be modified in various ways and have various embodiments, and some specific embodiments will be illustrated in the drawings and explained in the detailed description of the invention.

It should be understood, however, that the present invention is not intended to be limited to particular embodiments, but includes all modifications, equivalents, and alternatives falling within the spirit and scope of the invention.

The terms first, second, etc. may be used to describe various components, but the components should not be limited by the terms. The terms are used only for the purpose of distinguishing one component from another. For example, without departing from the scope of the present invention, the first component may be referred to as a second component, and similarly, the second component may also be referred to as a first component. The term "and/or" includes any combination of a plurality of related listed items or any of a plurality of related listed items.

Hereinafter, preferred embodiments of the present invention will be described in detail with reference to the accompanying drawings. In order to facilitate the understanding of the present invention, the same reference numerals are used for the same constituent elements in the drawings and redundant explanations for the same constituent elements are omitted.

Memory Module Heating Test

As previously noted, in the case of semiconductor integrated circuit devices, such as memory modules, normal operation in a high temperature environment should be guaranteed.

Thus, a high temperature test should be performed to test whether the integrated circuit device to be tested normally operates while maintaining in a predetermined temperature range. However, in the conventional high temperature test, a method of preparing a chamber capable of accommodating an integrated circuit device and arranging a heating means within the chamber to allow the temperature in the chamber to reach a predetermined temperature by heating has been mainly used, but in this method, a temperature difference may occur in the chamber depending on positions among the spaces, and the desired temperature may not be applied to a particular integrated circuit device among a plurality of integrated circuit devices. In addition, there is also a problem in that a separate heating means is used, which takes a long time in terms of power consumption and composition of the temperature environment.

The present invention has been made to solve the above problems, and disclosed is an integrated circuit device testing apparatus and method for performing a heating test on an integrated circuit without having a chamber by transferring a heating traffic data pattern capable of raising the temperature of an integrated circuit to be tested to a target temperature using heat generated by the integrated circuit itself, to the integrated circuit to be tested, and for controlling the temperature individually and precisely for a plurality of integrated circuit devices by receiving information about the temperature of the integrated circuit device from a temperature sensor built in each integrated circuit device.

FIG. 1 is a conceptual diagram of a heating test for a memory module according to an embodiment of the present invention. As shown in FIG. 1, an apparatus for performing a heating test of a memory module according to an embodiment of the present invention includes a smart heating manager 10, a heating traffic engine 20, a test traffic engine 30, a multiplexer 40 and a CPGC engine 50.

The smart heating manager 10 can receive information about the measured temperature of a memory module 60 from a temperature sensor 65 built in the memory module 60 to be tested. The smart heating manager 10 can determine whether the memory module 60 to be tested is within a predetermined temperature range for high temperature testing based thereon, and in response to the determination that the temperature of the memory module 60 to be tested does not belong to the temperature range for the heating test, the smart heating manager 10 can allow the heating traffic data pattern transmitted from the heating traffic engine 20 to be transmitted to the memory module 60. The heating traffic data pattern may be stored in the memory module as patterned data, thereby raising the temperature of the memory module. In order to rapidly raise the temperature of the memory module 60 to a desired temperature, the heating traffic data pattern may be configured to store a large amount of data concurrently in the memory module and may be configured to allow a wide bandwidth available in the memory module 60 to be used simultaneously. According to an aspect of the present invention, a test apparatus for a memory module according to an embodiment of the present invention may include a Converged Pattern Generator and Checker (CPGC) engine 50 of the Intel® Corporation designed for diagnosing performance of an integrated circuit. The heating traffic data pattern may have been generated by appropriately selecting a pattern of a type capable of quickly and accurately raising the temperature of the memory module 60 to a desired temperature, among the basic patterns of the CPGC engine designed for the performance diagnosis of integrated circuits According to an aspect, an appropriate pattern for temperature rise may be predetermined, for example, by a preliminary experiment based on the temperature of the memory module and the target temperature, and prepared in the form of a look-up table. By raising the temperature of the memory module 60 based on the heating traffic data pattern as described above, the temperature of the memory module 60 can be controlled within a temperature range for the heating test without having a separate chamber and/or heating means.

In response to the determination of the smart heating manager 10 that the temperature of the memory module 60 is within the temperature range for the heating test based on the information about the temperature from the temperature sensor 65, the test traffic data pattern from the test traffic engine 30 may be transmitted to the memory module 60. The test traffic data pattern may include data for testing whether the memory module 60 is operating normally. The test of normal operation may include, for example, whether or not to respond to control of the AC parameters. According to an aspect of the present invention, as described above, a test apparatus for a memory module according to an embodiment of the present invention includes a Converged Pattern Generator and Checker (CPGC) engine 50 designed by Intel Corporation for diagnosing performance of an integrated circuit, and the test traffic data pattern may be a data pattern generated by the CPGC engine.

According to an aspect, the information from the heating traffic engine 20 and the test traffic engine 30 may be combined by the multiplexer 40 and sent to the CPGC engine 50 so that the memory module 60 is heated, and a functional test for the module 60 can be performed simultaneously. For example, a pattern for a functional test and a pattern for temperature rise, which do not need to reach a predetermined temperature range, may be transferred to the memory module 60 in an integrated form, to thereby perform the functional test and, at the same time, create an environment for the heating test. Further, even in the case that the temperature of the memory module 60 already reaches a predetermined range for the high temperature test, the pattern for the functional test at the high temperature and the pattern for maintaining the temperature range of the memory module 60 may be transferred to the memory module 60 in an integrated form, to thereby prevent the temperature from deviating from the predetermined temperature range during the high temperature test, thereby performing a stable and accurate high temperature test. According to an aspect, the integrated pattern may be at least one selected from the basic patterns provided by the CPGC engine.

In recent years, test equipment for modern double data rate (DDR) memories is usually based on ASICs or FPGAs. In the case of memory testers based on ASICs or FPGAs, there is a problem that it is difficult to keep pace with the development of increasingly advanced CPU and memory clock speeds. From the test equipment for DDR 3 memory, there has already been a problem with the speed response. Some of the specific equipments have barely overcome the 2 Gbps limit, but for example, in order to cope with the speed of future memory such as DDR5, more cost and efforts are required. In other words, the use of ASIC or FPGA method in the case of general memory test equipment has a problem in terms of period and price rise for SoC development, and it is difficult to overcome the speed which is improved due to physical limits such as FPGA data processing capacity. As described above, the test equipment of the integrated circuit device according to an exemplary embodiment of the present invention can be configured based on a commercial processor having a CPGC engine. Thus, modern DDR4 RAMs, as well as DDR5 memory, for example, can be used together with future high-speed memories such as DDR5 memory, and it is possible to perform a test on memory with a real clock. In addition, after the ATE (Automated Test Equipment) test including the AC parameter test and the DC test is performed, the mounting test can be performed without detaching the memory module to be tested.

Although the memory module has been described above as an example, the test apparatus and method according to the present invention can be widely applied to an integrated circuit device. Further, the smart heating manager 10, the heating traffic engine 20, the test traffic engine 30, the multiplexer 40 and the CPGC engine 50 shown in FIG. 1 may be implemented as hardware and/or software modules, and may be implemented in a manner that at least one module is included in a plurality of processors. For example, a commercial processor including a CPGC engine and a second processor, in which the smart heating manager 10, the heating traffic engine 20 and the test traffic engine 30 are implemented in a module form, can be separately provided and implemented.

Hereinafter, an apparatus and method for testing an integrated circuit device according to an embodiment of the present invention will be described in more detail.

Integrated Circuit Device Testing Device

Figure 2:
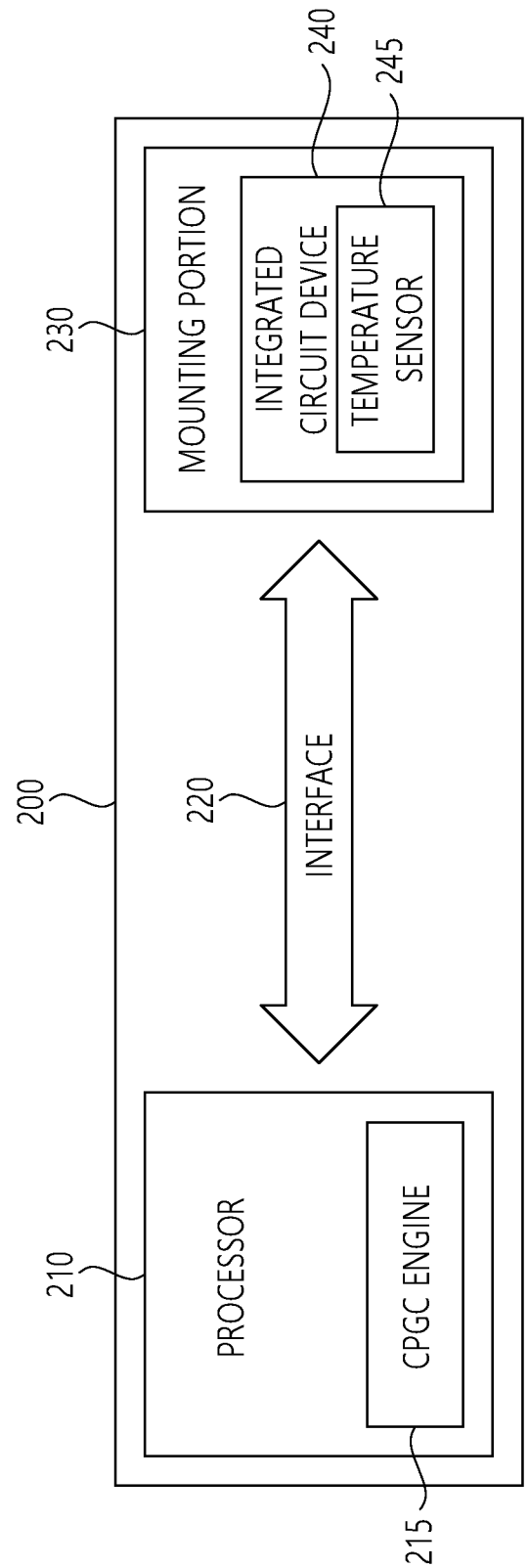
FIG. 2 is a block diagram showing the configuration of an apparatus for testing an integrated circuit device according to an embodiment of the present invention.

FIG. 2 is a block diagram showing the configuration of an apparatus for testing an integrated circuit device according to an embodiment of the present invention. Referring to FIG. 2, an integrated circuit device testing apparatus 200 according to an embodiment of the present invention may include a processor 210, an interface 220, and at least one mounting portion 230.

The mounting portion 230 is configured to receive an integrated circuit device 240 to be tested, and may be, for example, a DIMM slot. The plurality of mounting portions 230 may be configured to receive the integrated circuit device 240 to be tested, and the integrated circuit device testing apparatus 200 according to an exemplary embodiment of the present invention can test the plurality of integrated circuit devices 240 to be tested in parallel without any delay.

The processor 210 may be configured to transmit and receive data to and from the test target integrated circuit device 240 received at the mounting portion 230 via the interface 220. According to an aspect, the processor 210 may receive information about the temperature of each of the at least one test target integrated circuit device 240 from a temperature sensor 245, each embedded in at least one test target integrated circuit device 240 via the interface 220. That is, by receiving the measured temperature value from the temperature sensor 245 embedded in the integrated circuit device 240, the temperature of the integrated circuit device 240 can be measured without a separate temperature sensor provided by the testing apparatus 200, and it is possible to more accurately measure the temperature of the integrated circuit device 240 and to measure the temperature of each integrated circuit device 240 individually.

Based on information about the temperature of the integrated circuit device 240 to be tested, the processor 210 may determine whether the temperature of each of the at least one test target integrated circuit device 240 has reached a target temperature for the heating test. The target temperature may be set as the lower limit of the temperature range for the heating test and may be set as the temperature raised by a predetermined offset value at the lower limit.

The processor 210 may be configured to transfer the heating traffic data pattern, which is configured to raise the temperature of at least one test target integrated circuit device 240 to a target temperature according to the heating test condition, to the at least one test target integrated circuit device 240 via the interface 220 in response to the determination that the temperature of the at least one test target integrated circuit device 240 has not reached the target temperature for the heating test. That is, the processor 210 may allow the integrated circuit device 240 to self-heat by transferring predetermined patterned data to the integrated circuit device 240 to thereby raise the temperature of the integrated circuit device 240 to the target temperature. Thus, the integrated circuit device testing apparatus 200 can perform a heating test on an integrated circuit device without having a heating chamber by delivering a heating traffic data pattern to the at least one test target integrated circuit device.

According to an aspect, the processor 210 may be configured to generate a heating traffic data pattern based on a difference between a temperature of each of the at least one test target integrated circuit device 240 and a target temperature for the heating test. That is, the heating traffic data pattern may be adaptively generated according to the difference between the current temperature of the integrated circuit device 240 and a predetermined target temperature. According to one aspect, a specific temperature of the integrated circuit device 240 and a suitable pattern according to a particular target temperature may be predetermined by a preliminary experiment and stored in a database, and in testing the integrated circuit device 240, it may be configured to select a pattern according to the temperature and the target temperature of the integrated circuit device 240 based on the database.

According to another aspect, the integrated circuit device 240 may be a memory module and the processor 210 may generate a heated traffic data pattern such that the greater the difference between the temperature and the target temperature of each of the at least one test target integrated circuit device 240, the more information is simultaneously written to the test target integrated circuit device 240. Further, the integrated circuit device 240 may be a memory module and the processor 210 may generate a heated traffic data pattern such that the greater the difference between the temperature and the target temperature of each of the at least one test target integrated circuit device 240, the more bandwidth is simultaneously used in the test target integrated circuit device 240. According to another aspect, the greater the difference between the temperature of the integrated circuit device 240 and the target temperature, the more information is recorded simultaneously, and the integrated circuit device 240 may generate a heated traffic data pattern such that more bandwidth is used concurrently.

The inventors of the present invention have found that as more data is simultaneously written to a memory module, more heat is generated in the memory module more quickly, and as more memory modules simultaneously use more bandwidth at the same time, more heat is generated in the memory module more quickly. Based on this finding, in a heating test of an integrated circuit device according to an aspect of the present invention, a heating traffic data pattern may be generated to control the amount of data being simultaneously written to the integrated circuit device 240 and/or the amount of bandwidth used at the same time, based on the conditions of the temperature of the current integrated circuit device 240 and/or the temperature to be raised.

As discussed above, the processor 210 of the integrated circuit device testing apparatus 200 according to an embodiment of the present invention may include a Converged Pattern Generator and Checker (CPGC) engine 215. The CPGC engine may be, for example, a module implemented as software or hardware, and may facilitate functional testing of the integrated circuit device based on the focused patterns. Here, a particular one of the patterns for testing of the integrated circuit device can be used to quickly raise the temperature of the integrated circuit device 240. According to an aspect, a heating traffic data pattern according to an embodiment of the present invention may be generated by selecting at least one of data patterns for performance testing of a memory device defined by the CPGC engine 215. For example, a pattern corresponding to the temperature of the integrated circuit device 240 obtained from the temperature sensor 245 of the integrated circuit device 240 and the target temperature, respectively, is determined by a preliminary experiment, and may be made as a database in the form of a lookup table.

Referring again to FIG. 2, In response to the determination that the temperature of the at least one test target integrated circuit device 240 is within the temperature range for the predetermined heating test or has reached the target temperature, the processor 210 may transfer the test traffic data pattern for testing the operation of the at least one test target integrated circuit device 240 to the at least one test target integrated circuit device 240 via the interface, to thereby perform a test for the integrated circuit device 240.

As discussed above, the CPGC engine 215 may be embedded in the processor 210, and the test traffic data pattern may be a data pattern by the CPGC engine. Further, the data pattern transferred from the processor 210 to the integrated circuit device 240 via the interface 220 may be an integrated pattern for both heating and functional testing. For example, the predetermined temperature range of the integrated circuit device 240 may be set differently depending on the function to be tested, and a data pattern may be generated and communicated to the integrated circuit device 240 via the interface 220 as an integrated form of a pattern for testing a function that satisfies a temperature range and a pattern for raising the temperature of the integrated circuit device. Alternatively, a data pattern may be generated as a form of an integrated pattern of a heating pattern for keeping the temperature within a predetermined temperature range and a pattern for testing the integrated circuit device 240 and may be transmitted to the integrated circuit device 240 via the interface 220 even in the case that the temperature range of the integrated circuit device 240 is satisfied. Such an integrated pattern may be a selected one of the patterns defined by the CPGC engine 215.

In an integrated circuit device testing apparatus 200 according to an aspect of the present invention, a real clock test for the memory device may be performed by using a commercial processor (e.g., Intel® processor) having a CPGC engine as the processor 210. That is, the integrated circuit device 240 may be allowed to perform testing with the same clock as is actually used. In addition, by using a commercial processor having a CPGC engine as the processor 210, after the ATE (Automatic Test Equipment) test for test target integrated circuit device, the test target integrated circuit device 240 may be configured to perform a mounting test on the test target integrated circuit device 240 without transferring the test target integrated circuit device 240 to a separate device.

Further, by using a commercial processor, the integrated circuit device testing apparatus 200 can easily increase scalability. Testing of various types of integrated circuit devices 240 used with commercial processors can be easily performed. The integrated circuit device 240 may be a memory module and is capable of performing tests on memory modules of various standards, such as at least one of DDR3, DDR4, and DDR5 DRAMs of the JEDEC standard. In addition, the memory module may be at least one of various types of memory modules such as an Unbuffered Dual In-line Memory Module (UDIMM), a Small Outline Dual In-line Memory Module (SODIMM), a Registered Dual In-line Memory Module (RDIMM), and a Load Reduction Dual In-Line Memory Module (LRDIMM), and the mounting portion 230 of FIG. 2 may be provided according to the type of the memory module. Further, the new memory module of a type and standard to be developed in the future can be easily tested only by replacing a commercial processor and/or a board supporting the memory module. Therefore, it has improved scalability compared to conventional ATE test apparatus based on ASIC or FPGA.

Although a single processor 210 is shown in FIG. 2, a plurality of processors may be included in the integrated circuit device testing apparatus 200 according to one embodiment of the present invention, a separate processor may be included in a separate device configured to transmit and receive data separately from entities including a commercial processor, and it may be configured to perform at least some of the operations of the processor of the integrated circuit device testing apparatus according to an embodiment of the present invention.

Figure 3:
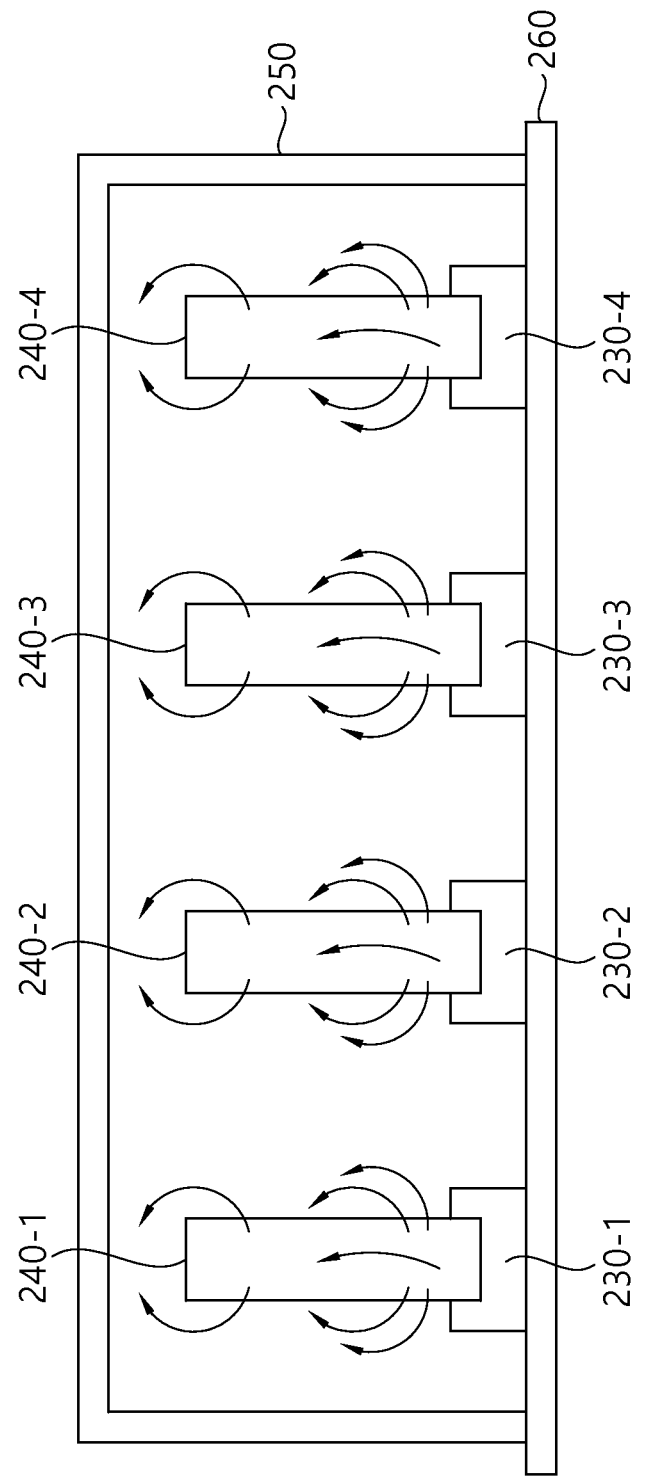
FIG. 3 is a schematic diagram of heat generation according to an apparatus for testing an integrated circuit device according to a first embodiment.

FIG. 3 is a schematic diagram of heat generation according to the integrated circuit device testing apparatus according to the first embodiment, and FIG. 4 is a schematic diagram of heat generation according to the integrated circuit device testing apparatus according to the second embodiment. As illustrated in FIG. 3, according to an aspect of the present invention, mounting portions 230-1, 230-2, 230-3, and 230-4 configured to receive a plurality of integrated circuit devices 240-1, 240-2, 240-3, and 240-4, respectively may be provided, and the mounting portions 230-1, 230-2, 230-3, and 230-4 may be disposed on the mainboard 260. When the heating traffic data pattern is transmitted to each of the integrated circuit devices 240-1, 240-2, 240-3, and 240-4 by the processor 210, each of the integrated circuit devices 240-1, 240-2, 240-3, and 240-4 generates heat. A cover 250 may be provided to prevent heat generated by the integrated circuit devices 240-1, 240-2, 240-3, and 240-4 from being copied and to increase heat efficiency. The cover 250 may be configured to simultaneously cover a plurality of integrated circuit devices 240-1, 240-2, 240-3, and 240-4 as shown in FIG. 3, or may be implemented as individual covers 250-1, 250-2, 250-3, and 250-4 covering each integrated circuit device among the plurality of integrated circuit devices 240-1, 240-2, 240-3, and 240-4 as illustrated in FIG. 4.

It should be noted that although the characteristics of the heating test environment composition through the transfer of the data pattern have been described mainly based on the ATE test, the technical characteristics of the heating test environment composition through the transfer of the data pattern can also be applied to the mounting test.

Integrated Circuit Device Testing Method

FIG. 5 is a flowchart of a method of testing an integrated circuit device according to an embodiment of the present invention. The method of testing an integrated circuit device according to an embodiment of the present invention may be performed by a computing device or a processor included in a computing device. A processor in accordance with an embodiment of the present invention may be configured to perform data transmission and reception with at least one test target integrated circuit device via an interface.

According to the method of testing an integrated circuit device according to an embodiment of the present invention, first, at least one test target integrated circuit device is prepared, and a heating traffic data pattern, which is configured to change the temperature of at least test target integrated circuit device to a target temperature, may be applied to the at least one test target integrated circuit device. Thereafter, a test traffic data pattern for testing the operation of the at least one test target integrated circuit device may be applied to the at least one test target integrated circuit device.

Hereinafter, a method for testing an integrated circuit device according to an embodiment of the present invention will be described in more detail with reference to FIG. 5. As shown in FIG. 5, an integrated circuit device testing method according to an embodiment of the present invention includes receiving information on the temperature of at least one test target integrated circuit device from the temperature sensor embedded in each of the at least one test target integrated circuit device via the interface (step 510). That is, information about the temperature of the test target integrated circuit device may be collected from individual temperature sensors included in each of the at least one test target integrated circuit device.

Upon receiving information about the temperature of the test target integrated circuit device, information about the collected temperature may be classified as, for example, maximum/minimum/intermediate values and stored (step 515). According to one aspect, a value classified as the maximum may be a high temperature value exceeding a predetermined temperature range to perform the test, a value classified as the minimum may be a low temperature value that is below a predetermined temperature range to perform the test, and a value classified as the medium may be a temperature value included in a predetermined temperature range to perform the test. According to another aspect, a predetermined margin value for classification is defined, a value classified as the maximum may be a high temperature value that exceeds a predetermined margin value to perform a test in a predetermined temperature range, a value classified as the minimum may be a low temperature value that is less than a predetermined margin value to perform the test, and a value classified as the medium may be a temperature value at which the degree of deviation from the predetermined temperature range to perform the test does not exceed the predetermined margin value.

Thereafter, based on the information about the received temperature, it may be determined whether the temperature of each of the at least one test target integrated circuit device has reached a target temperature according to the heating test condition (step 520). According to one aspect, whether or not the target temperature has been reached can be determined based on whether or not the temperature value from all the temperature sensors has reached the target temperature range.

Here, in response to the determination that the temperature of each of the test target integrated circuit devices has not reached the target temperature, temperature control for each of the at least one test target integrated circuit devices may be performed (step 530). Here, the temperature control may be performed based on information about the temperature of the received at least one test target integrated circuit device.

According to an aspect, temperature control for each of the test target integrated circuit devices may be performed based on classification of maximum/minimum/intermediate values for the collected temperature. For example, as shown in FIG. 5, it is determined whether the temperature value of the integrated circuit device is classified as the maximum (step 531). If it is determined that the temperature value is classified as maximum, the operation stop/voltage adjustment of the integrated circuit device may be performed aiming at the intermediate temperature (step 532). In addition, it is determined whether the temperature value of the integrated circuit device is classified as the minimum (step 533). If it is determined that the temperature value is classified as the minimum, the voltage of the integrated circuit device is adjusted to a maximum value aiming at the intermediate temperature (step 534). It may also be determined whether the temperature value of the integrated circuit device has been classified as intermediate (step 535), and if it is determined that the temperature value has been classified as intermediate, the traffic pattern may be periodically adjusted to maintain the temperature (step 536).

According to another aspect, the temperature control may be configured to perform at least one of an operation stop of the first integrated circuit device and an operating voltage adjustment of the first integrated circuit device in response to the determination that the temperature of the first integrated circuit device is higher than the target temperature, and to perform at least one of operations of applying a heating traffic data pattern to the second integrated circuit device and adjusting the operating voltage of the second integrated circuit device to the maximum (step 530). It may also be configured to periodically adjust the traffic data pattern applied to the third integrated circuit device to maintain the temperature of the third integrated circuit device in response to the determination that the temperature of the third integrated circuit device is within the target temperature range.

Referring again to FIG. 5, in response to the determination that the temperature of all the test target integrated circuit devices has reached the target temperature, a test on the operation of the at least one test target integrated circuit device may be performed (step 540). It may be determined whether it is a start procedure of testing for the operation of at least one test target integrated circuit device (step 541), and when the test is started, a test pattern writing to the integrated circuit device may be performed (step 543). According to one aspect, a test for an integrated circuit device can be initiated by delivering a test traffic data pattern for testing the operation of the at least one test target integrated circuit device to the at least one test target integrated circuit device via the interface. On the other hand, if it is determined that the test has been started (step 541), the test pattern may be read from the integrated circuit device and the temperature information may be stored in the defect information (step 545). Thus, the test for the integrated circuit device can be completed.

Herein, the test according to the test traffic data pattern may be an ATE test including an AC test and a DC test. By passing the heating traffic data pattern to the at least one test target integrated circuit device as described above, a heating test for the integrated circuit device can be performed without the heating chamber.

According to one aspect, the processor may include a Converged Pattern Generator and Checker (CPGC) engine, and the heating traffic data pattern may be generated by selecting at least one of the data patterns for performance testing of the memory device defined by the CPGC engine.

Here, by using a commercial processor having a CPGC engine as a processor, a test for an integrated circuit device can be performed as a real clock test, and also by using a commercial processor having a CPGC engine as a processor, a test for the test target integrated circuit device may be performed without transferring the test target integrated circuit device to a separate device after performing an ATE test including an AC test and a DC test, The detailed features of the method of testing an integrated circuit device according to an embodiment of the present invention may further include an operation characteristic of an integrated circuit device testing apparatus according to an embodiment of the present invention described above.

The above-described method according to the present invention can be implemented as a computer-readable code on a computer-readable recording medium. The computer-readable recording medium includes all kinds of recording media storing data that can be decoded by a computer system. For example, there may be a ROM (Read Only Memory), a RAM (Random Access Memory), a magnetic tape, a magnetic disk, a flash memory, an optical data storage device and the like. The computer-readable recording medium may also be distributed and executed in a computer system connected to a computer network and stored and executed as a code that can be read in a distributed manner.

Although the present invention has been described with reference to the drawings and the embodiments, it is not intended to limit the scope of the present invention by the drawings or the examples, and it will be understood by those skilled in the art that various changes in form and details may be made therein without departing from the spirit and scope of the invention as defined in the following claims.

What is claimed is:

1. An apparatus for testing an integrated circuit device, the apparatus comprising:
   a processor;
   at least one mounting portion configured to accommodate at least one integrated circuit device to be tested; and
   an interface configured to connect the processor to the at least one integrated circuit device to allow data transmission and reception therebetween,
   wherein the processor is configured to transfer a heating traffic data pattern, which is configured to raise a temperature of the at least one integrated circuit device using heat generated by the at least one integrated circuit device itself to a target temperature according to heating test conditions, to the at least one integrated circuit device via the interface,
   wherein the processor is configured to transfer a test traffic data pattern to be used for testing an operation of the at least one integrated circuit device to the at least one integrated circuit device in response to a determination that the temperature of the at least one integrated circuit device has reached the target temperature, and
   wherein the processor adjusts the heating traffic data pattern to maintain the at least one integrated circuit device within a target temperature range while transmitting the test traffic data pattern.

2. The apparatus of claim 1, wherein the apparatus is configured to perform a heating test for the integrated circuit device without a heating chamber by transferring the heating traffic data pattern to the at least one integrated circuit device.

3. The apparatus of claim 1, wherein the processor is configured to receive information on the temperature of each of the at least one integrated circuit device from each temperature sensor embedded in the at least one integrated circuit device via the interface and to determine whether the temperature of each of the at least integrated circuit device has reached the target temperature based on the received information on the temperature.

4. The apparatus of claim 3, wherein the processor is configured to generate the heating traffic data pattern based on a difference between the temperature of each of the at least one integrated circuit device and the target temperature.

5. The apparatus of claim 3, wherein the integrated circuit device is a memory module, and
   wherein the processor is configured to generate the heating traffic data pattern such that as the difference between the temperature of each of the at least one integrated circuit device and the target temperature gets greater, more information is simultaneously recorded in the at least one integrated circuit device.

6. The apparatus of claim 5, wherein the processor includes a converged pattern generator and checker (CPGC) engine, and
wherein the heating traffic data pattern is generated by selecting at least one of data patterns for a performance test of a memory device defined by the CPGC engine.

7. The apparatus of claim 6, wherein the apparatus is configured to perform a real clock test for the memory device by using a commercial processor including the CPGC engine as the processor.

8. The apparatus of claim 6, wherein the apparatus is configured to perform a mounting test for the at least one integrated circuit device without transferring the at least one integrated circuit device to a separate device after performing an automatic test equipment (ATE) test for the at least one integrated circuit device by using a commercial processor including the CPGC engine as the processor.

9. The apparatus of claim 5, wherein the memory module includes at least one of double data rate (DDR) 3, DDR 4 and DDR 5 DRAM of JEDEC standard.

10. The apparatus of claim 5, wherein the memory module includes at least one of an unbuffered dual in-line memory module (UDIMM), a small outline dual in-line memory module (SODIMM), a registered dual in-line memory module (RDIMM), and a load reduction dual in-line memory module (LRDIMM).

11. The apparatus of claim 3, wherein the integrated circuit device is a memory module, and
wherein the processor is configured to generate the heating traffic data pattern such that as the difference between the temperature of each of the at least one integrated circuit device and the target temperature gets greater, broader bandwidth is simultaneously used in the at least one integrated circuit device.

12. A method of testing an integrated circuit device by a processor, the processor being configured to transmit and receive data to and from at least one integrated circuit device to be tested via an interface, the method comprising:
receiving information on each temperature of the at least one integrated circuit device from each temperature sensor embedded in the at least one integrated circuit device via the interface;
determining whether each temperature of the at least one integrated circuit device has reached a target temperature according to heating test conditions based on the received information on the temperature;
transferring a heating traffic data pattern, which is configured to raise the temperature of the at least one integrated circuit device using heat generated by the at least one integrated circuit device itself to the target temperature, to the at least one integrated circuit device via the interface in response to a determination that each temperature of the at least one integrated circuit device has not reached the target temperature;
applying a test traffic data pattern to be used for testing an operation of the at least one integrated circuit device, to the at least one integrated circuit device; and
adjusting the heating traffic data pattern to maintain the at least one integrated circuit device within a target temperature range while applying the test traffic data pattern.

13. A method of testing an integrated circuit device by a processor, the method comprising:
preparing at least one integrated circuit device to be tested;
applying a heating traffic data pattern, which is configured to change a temperature of the at least one integrated circuit device using heat generated by the at least one integrated circuit device itself to a target temperature, to the at least one integrated circuit device;
applying a test traffic data pattern to be used for testing an operation of the at least one integrated circuit device, to the at least one integrated circuit device; and
adjusting the heating traffic data pattern to maintain the at least one integrated circuit device within a target temperature range while applying the test traffic data pattern.

14. A method of testing an integrated circuit device by a processor, the method comprising:
receiving information on a temperature of each of at least one integrated circuit device;
performing temperature control for each of the at least one integrated circuit device using heat generated by the at least one integrated circuit device itself based on the information on the temperature;
applying a test traffic data pattern to be used for testing an operation of the at least one integrated circuit device, to at least one integrated circuit device; and
adjusting temperature of each of the at least one integrated circuit device using heat generated by the at least one integrated circuit itself to maintain the at least one integrated circuit device within a target temperature range while applying the test traffic data pattern.

15. The method of claim 14, wherein the performing temperature control comprises:
performing temperature control for each of a first integrated circuit device and a second integrated circuit device,
wherein the performing temperature control comprises performing at least one of an operation stop of the first integrated circuit device and an operating voltage adjustment of the first integrated circuit device in response to a determination that a temperature of the first integrated circuit device is higher than a target temperature; and
wherein the performing temperature control comprises performing at least one of an operation of applying a heating traffic data pattern to the second integrated circuit device and an operation of adjusting an operating voltage of the second integrated circuit device to a maximum value in response to a determination that a temperature of the second integrated circuit device is higher than the target temperature.

16. The method of claim 14, wherein the performing of the temperature control comprises:
periodically adjusting a traffic data pattern applied to a third integrated circuit device in order to maintain a temperature of the third integrated circuit device in response to a determination that a temperature of the third integrated circuit device is within a target temperature range.

* * * * *